United States Patent [19]
Pandey

[11] 3,939,252
[45] Feb. 17, 1976

[54] DILITHIUM HEPTAMOLYBDOTETRAGADOLINATE

[75] Inventor: Raghvendra K. Pandey, Dayton, Ohio

[73] Assignee: NCR Corporation, Dayton, Ohio

[22] Filed: Mar. 6, 1974

[21] Appl. No.: 448,769

[52] U.S. Cl. .............. 423/263; 423/593; 252/62.9; 23/305 RE; 156/617; 156/619; 156/624
[51] Int. Cl.² .................... C01F 17/00; C01G 39/00
[58] Field of Search .......... 423/263, 593; 252/62.9; 23/305 RE; 156/617, 619, 624

[56] References Cited
UNITED STATES PATENTS

| | | | |
|---|---|---|---|
| 3,437,432 | 4/1969 | Barchardt | 423/263 |
| 3,796,585 | 3/1974 | Wanmaker et al. | 423/263 X |

OTHER PUBLICATIONS

Klevtsov et al., "Chemical Abstracts", Vol. 72, 1970, abst. No. 71509v.

Savel'eva et al., "Chemical Abstracts", Vol. 79, 1973, abst. No. 129734c.

Bruner et al., "Chemical Abstracts", Vol. 82, 1975, abst. No. 79894u.

*Primary Examiner*—Herbert T. Carter
*Attorney, Agent, or Firm*—Robert J. Shafer; E. Frank McKinney

[57] ABSTRACT

Dilithium heptamolybdotetragadolinate, $Li_2Gd_4(MoO_4)_7$, is disclosed, along with three methods to prepare it. Two of the three methods are useful for growing single crystals of the material. The material exhibits electro-optic, paramagnetic and ferroelectric properties.

3 Claims, No Drawings

DILITHIUM HEPTAMOLYBDOTETRAGADOLINATE

BACKGROUND OF THE INVENTION

Field of the Invention - This invention relates to an inorganic compound characterized by the compositional formula $Li_2Gd_4(MoO_4)_7$ and bearing the preferred name of dilithium heptamolybdotetragadolinate. It further pertains to single crystals of the subject compound and to methods for making crystals of the compound.

SUMMARY OF THE INVENTION

In recent times there has been considerable activity in the area of inorganic single crystal growth by reacting rare earth oxides with molybdenum or tungsten oxides at elevated temperatures. Such single crystals of rare earth molybdates or rare earth tungstates often exhibit paramagnetic and ferroelectric properties. Some such single crystals have also been found to be ferroelastic. As an example, it is noted that gadolinium molybdate, $Gd_2(MoO_4)_3$, exhibits ferroelastic properties. It has been suggested in the prior art that single crystals are useful as synthetic gemstones and it is true that crystals of the material claimed herein find use in such an application. Single crystals of the material claimed herein also find practical application in the fields of electro-optics, display, computer memory, logic, light gate, light modulation, and the like.

The material of this invention has a composition of definite stoichiometry and is made by combination of definite amounts of particularly specified materials in a process requiring closely-controlled time and temperature conditions.

It is an object of this invention to provide the title compound—dilithium heptamolybdotetragadolinate—having the molecular formula $Li_2Gd_4(MoO_4)_7$.

It is further an object of this invention to provide the title compound in single crystal form. Additional objects are to provide methods for making the compound and for making the compound in single crystal form.

DETAILED DESCRIPTION OF THE INVENTION

Critical aspects of the invention include the kinds and amounts of starting materials and the temperatures and times for the process of manufacture.

The starting materials are gadolinium oxide ($Gd_2O_3$, molecular weight 362.5), molybdenum trioxide ($MoO_3$, molecular weight 143.9, melting point 795°C.), and lithium molybdate ($Li_2MoO_4$, molecular weight 173.8, melting point 705°C.) and they are used in a respective mole ratio of 2:6:1.

The process for manufacturing crystals of the title material can be conducted by techniques of slow cooling, crystal pulling, zone melting, and the like.

The process herein resides in, first, preparing the title material in polycrystalline form and, next, growing single crystal material from the polycrystalline material.

It has been discovered that the title material can be prepared by firing the starting materials, in appropriate mole ratios, at a temperature of about 800 to 1150 degrees centigrade. The firing temperatures must be selected to be above the melting points of the molybdenum trioxide and the lithium molydbate and below any temperatures of instability. For example, molybdenum trioxide sublimes at near about 1150 degrees centigrade and firing at above that temperature would result in stoichiometric imbalance by sublimation of that component.

EXAMPLE 1

To prepare the title material in polycrystalline form, a powder charge of 41.14 parts, by weight, gadolinium oxide; 49.0 parts, by weight, molydbenum trioxide; and 9.86 parts, by weight, lithium molybdate and mixed together in an open platinum crucible and heated at about 500° centigrade for a few hours to drive off adsorbed water and organic contaminants. The crucible is then fitted with a tight platinum cover and the charge is fired at about 825° centigrade. The firing is maintained at that temperature for about six hours to assure completion of the reaction and establishment of molecular homogeneity in the composition. The firing temperature could be varied from about 800° centigrade to about 1150° centigrade; but, at this stage in the procedure, it is not advisable to raise the firing temperature much higher than 1100° centigrade because such high temperature could melt the composition, as it is formed and, on cooling, the composition might be difficult to remove from the crucible. After completion of the firing period, the composition is rapidly cooled to room temperature in an uncontrolled manner and ground to a fine powder. During the period of maintaining the temperature, a thermal reaction occurs and the title compound is formed. The ground powder is polycrystalline dilithium heptamolybdotetragadolinate and has a melting point of about 1125°–1130° centigrade.

It should be noted that the gadolinium oxide has a very high melting temperature and does not melt at any time during formation of the title compound. The molybdenum trioxide and lithium molybdate melt and react with the solid gadolinium oxide to yield the title compound.

The starting materials are all commercially available. For example, each can be obtained from ROC/RIC, Inc., Sun Valley, California.

EXAMPLE 2

A portion of the polycrystalline material of Example 1 is melted at about 1150 degrees centigrade in a tightly lidded platinum crucible and that temperature is maintained for some time to achieve an equilibrium in the system. Six hours is an adequate time. The temperature of the melt can range from about 1130° to 1250° centigrade. The lower temperature is established by the melting point of the material and the upper temperature is established for reasons of practicality such as consideration of possible reaction of the melt with the crucible material, limitations of the heating apparatus itself, needless use of excess energy to heat to, and excess time to cool from, higher temperatures, and the like.

Then, cooling is commenced at a rate of about 2.5° degrees centigrade per hour and continued until the temperature reaches about 850° to about 500° centigrade. It is noted that the melt is completely solidified well above a temperature of 1000° centigrade. The slow rate of cooling beyond the fusion point of the title material is necessary to relieve internal stresses in the crystals by annealing the crystal structure. The optimum cooling rate over the crystallization and annealing temperature range is determined by well-known criteria. At the fusion temperature, the slower the removal of thermal energy, the more likely it is that larger single crystals will be formed because slower cooling promotes a fewer number of crystal nucleation sites. Moreover, fused materials cooled rapidly from the higher temperatures suffer internal crystal lattice stresses resulting in strains such as dislocations, twinning, low angle grain boundaries and the like. The annealing cooling rate may be varied from less than about 0.5° to about 5° centigrade per hour. The theoretically ideal cooling rate would be just short of zero; but, of course, the slow cooling must be set at a practical rate and is a matter of economy with regard to the time required for completion. It is desirable to cool as slowly as possible to secure the largest crystal size and yet complete the growth within a reasonable time.

The next cooling step, sometimes termed post-annealing, is conducted at a rate of about 100° centigrade per hour and continues from the lowest annealing temperature of about 850° to about 500° centigrade. Both the annealing and the post-annealing steps are performed to homogenize the crystals and avoid excess internal stresses. The lowest post-annealing temperature can be varied from about 400° to 600° centigrade and is not so critical as the lowest annealing temperature. On completion of the post-annealing step, the furnace is shut off and the material is thereby rapidly cooled to room temperature (about 20°–25° centigrade) with no control.

The above cooling procedure can be conducted as a single step at the rate of about 0.5° to about 5° centigrade per hour, or perhaps slightly faster at lower temperatures, down to about 400°–660° centigrade, over a time period of about 100–200 hours.

Single crystals are isolated from the cooled charge by crumbling the charge and separating the single crystals from polycrystalline material using a magnifying glass to aid in visual inspection of the materials. The single crystals are transparent with well-formed crystal faces and the polycrystalline material is opaque. Furthermore, the single crystal material is birefringent when viewed through a polarizing microscope and the polycrystalline material is not birefringent.

Single crystals made by this slow cooling process are as large as 4 millimeters on a short axis by 6 millimeters on a long axis.

EXAMPLE 3

In this Example, large single crystals of the title material are made by means of a vertical crystal pulling technique usually attributed to J. Czochralski in "Zertschrift fuer Physikalische Chemie", Volume 92, page 219 (1918). The Czochralski technique is well known and is generally described in texts relating to the crystal growth art. For example, the technique is described in "The Growth of Single Crystals" by R. A. Laudise published by Prentice-hall, New Jersey (1970).

A portion of the polycrystalline material of Example 1 is charged in a platinum crucible and is heated to about 1120° centigrade. The temperature is then adjusted to that required to just melt the charge and then the melt is maintained at that temperature for more than about an hour to equilibrate the system. A platinum rod about 2 millimeters in diameter is fixed in a chuck equipped for rotation and for carefully controlled, constant, vertical pulling travel. The rod is rotated at about 60 revolutions per minute, contacted with the melt to permit nucleation of a seed crystal and the rod is then adjusted up and down to cause the seed crystal to form a proper neck, in accord with known technique. The pulling is commenced and is controlled at a rate of about 2 millimeters per hour. As the rod is pulled, the crystal material is pulled and cooled, drawing additional material from the melt to be cooled and included in formation of the crystal. The crystal of this example is about 1 centimeter in diameter and the pulling is continued to yield a length of about 3 centimeters.

The diameter of the platinum rod can be varied as desired;—a thicker rod decreasing the time required for obtaining a seed crystal but increasing the likelihood of obtaining more than a single seed.

The rod rotation can be varied considerably but should preferably not exceed about 100 revolutions per minute. Single crystals of the title material have also been made using rotation rates of about 10 and about 35 revolutions per minute.

The crystal pulling rate can, also, be varied from, for example, about 1 to about 5 millimeters per hour;—again, the extremes being matters of practical consideration. As a general rule, as faster pulling rate results in a crystal of smaller diameter.

Dilithium heptamolybdotetragadolinate is transparent, birefringent and yellow in color. It has a tetragonal crystal structure of $a=b=5.192$ angstroms and $c=11.31$ angstroms. It exhibits ferroelectric domains when viewed along the c-axis through a polarizing microscope and is paramagnetic at room temperature (20°–25° centigrade), with an absolute value of magnetic susceptibility of $59.55 \times 10^{-6}$ cm$^3$/g. While it is believed that the title material is ferroelastic, the extent of ferroelasticity has not been determined.

The title compound represents one member of a family of rare-earth, alkali-metal, molybdates. Rare earths which can be substituted for gadolinium include: Samarium, Europium, Terbium, Dysprosium, Holmium, Erbium, Thulium and Ytterbium. Alkali metals which can be substituted for Lithium are: Sodium, Potassium, Rubidium and Cesium.

What is claimed is:

1. A method for the preparation of dilithium heptamolybdotetragadolinate represented by the formula $Li_2Gd_4(MoO_4)_7$ comprising the steps of:
    a. providing a charge of gadolinium oxide ($Gd_2O_3$), molybdenum trioxide ($MoO_3$) and lithium molybdate ($Li_2MoO_4$) in a respective mole ratio of 2:6:1;
    b. firing the charge at a temperature above about 800° centigrade and below about 1150° centigrade;
    c. maintaining the firing temperature for a time adequate to assure molecular homogeneity in the charge;
    d. increasing the temperature to about 1130° to 1250° centigrade;
    e. cooling from about 1130° to 1250° centigrate to about 400° to 600° centigrade over a period of about 100 to 200 hours; and
    f. cooling rapidly and without control to room temperature, and at least a portion of the dilithium heptamolybdotetragadolinate is in single crystal form.

2. A method for the preparation of dilithium heptamolybdotetragadolinate represented by the formula $Li_2Gd_4(MoO_4)_7$ comprising the steps of:
    a. providing a charge of gadolinium oxide ($Gd_2O_3$), molybdenum trioxide ($MoO_3$) and lithium molybdate ($Li_2MoO_4$) in a respective mole ratio of 2:6:1;

b. firing the charge at a temperature above about 800° centigrade and below about 1150° centigrade;

c. maintaining the firing temperature for a time adequate to assure molecular homogeneity in the charge;

d. increasing the temperature to about 1130° to 1250° centigrade;

e. cooling from about 1130° to 1250° centigrade to about 850 to 500 degrees centigrade at a rate of about 0.5 to 5 centigrade degrees per hour;

f. further cooling from about 850° to 500° centigrade to at least about 400° centigrade at a rate of about 100° centigrade per hour; and g. cooling rapidly and without control to room temperature, and at least a portion of the dilithium heptamolybdotetragadolinate is in single crystal form.

3. A method for the preparation of dilithium heptamolybdotetragadolinate represented by the formula $Li_2Gd_4(MoO_4)_7$ comprising the steps of:

a. providing a charge of gadolinium oxide ($Gd_2O_3$), molybdenum trioxide ($MoO_3$) and lithium molybdate ($Li_2MoO_4$) in a respective mole ratio of 2:6:1;

b. firing the charge at a temperature above about 800° centigrade and below about 1150° centigrade;

c. maintaining the firing temperature for a time adequate to assure molecular homogeneity in the charge and;

d. cooling the charge by means of the Czochralski vertical crystal pulling technique to yield a single crystal of dilithium heptamolybdotetragadolinate.

* * * * *